(12) United States Patent
Lee

(10) Patent No.: US 7,564,712 B2
(45) Date of Patent: Jul. 21, 2009

(54) FLASH MEMORY DEVICE AND WRITING METHOD THEREOF

(75) Inventor: Seung-Won Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 64 days.

(21) Appl. No.: 11/769,334

(22) Filed: Jun. 27, 2007

(65) Prior Publication Data

US 2008/0175056 A1  Jul. 24, 2008

(30) Foreign Application Priority Data

Jul. 25, 2006  (KR)  ...................... 10-2006-0069891

(51) Int. Cl.
*G11C 16/04*  (2006.01)
(52) U.S. Cl. ........................... 365/185.11; 365/185.18; 365/185.28; 365/201
(58) Field of Classification Search ............. 365/185.11, 365/185.18, 185.28, 201
See application file for complete search history.

(56) References Cited

U.S. PATENT DOCUMENTS

| | | | | |
|---|---|---|---|---|
| 5,343,434 A | * | 8/1994 | Noguchi | ................ 365/185.04 |
| 5,862,074 A | * | 1/1999 | Park | ...................... 365/185.03 |
| 6,067,248 A | * | 5/2000 | Yoo | ...................... 365/185.03 |
| 6,480,419 B2 | * | 11/2002 | Lee | ........................ 365/185.18 |
| 6,498,757 B2 | | 12/2002 | Kuo et al. | |
| 6,584,006 B2 | | 6/2003 | Viehmann | |
| 2005/0225251 A1 | * | 10/2005 | Hsueh | ..................... 315/169.2 |

FOREIGN PATENT DOCUMENTS

| | | |
|---|---|---|
| JP | 19900009092 | 1/1990 |
| JP | 10-283789 | 10/1998 |
| JP | 06-012875 | 1/2001 |
| KR | 1995-0001779 | 1/1995 |
| KR | 1020000019464 | 4/2000 |
| KR | 1020000038595 | 7/2000 |
| KR | 1020050022077 | 3/2005 |

* cited by examiner

*Primary Examiner*—Hoai V Ho
(74) *Attorney, Agent, or Firm*—F. Chau & Associates, LLC

(57) ABSTRACT

A flash memory device includes a memory cell array including a plurality of memory cells. A data writing buffer temporarily stores data to be written into the memory cells. A control circuit controls a write operation of the memory cells. A decoder decodes write address of the memory cell in response to the control circuit and regulating a constant current to flow through a selected bit line with reference to a result of the decoding. The decoder decodes an address and controls a current in units of a memory cell during a normal writing mode and decodes an address and controls a current in units of a memory block during a test writing mode.

20 Claims, 10 Drawing Sheets

FLASH MEMORY DEVICE AND WRITING METHOD THEREOF

CROSS-REFERENCE TO RELATED APPLICATIONS

This application claims priority under 35 U.S.C. § 319 to Korean Patent Application No. 10-2006-0069891 filed on Jul. 25, 2006, the entire contents of which are hereby incorporated by reference.

BACKGROUND

1. Technical Field

The present invention relates to flash memory and more particularly, to a flash memory device and writing method thereof.

Semiconductor memories are mostly classified into volatile and nonvolatile types. Volatile memory devices are faster in reading and writing data, but loose their data if there is loss of power supply. Nonvolatile memory devices retain their data even when there is loss of power supply. For that reason, nonvolatile memory devices are used to store data or information to be retained regardless of power supply. In many kinds of nonvolatile memory devices, flash memories or flash EEPROMs (electrically erasable and programmable read-only memories) are well suited for large-capacity storage units because of high integration density.

Flash memories may be generally differentiated into NAND and NOR types. NAND flash memories conduct writing and reading operations in the mechanism of Fowler-Nordheim (F-N) tunneling effect, while NOR flash memories conduct writing operations by hot electron injection and erasing operations by F-N tunneling effect. NOR flash memories, as code storage, are mostly employed in mobile telephone terminals desiring fast data processing because they are operable in high frequency.

NOR flash memories are divided into stacked and split gate types in accordance with a gate structure of the memory cells.

FIG. 1 is a section of a NOR flash memory cell 10 with a stacked gate structure.

Referring to FIG. 1, the memory cell 10 includes N+ source and drain regions 13 and 14 formed in a P-type substrate 19, an insulation film 15 with a thickness less than 100 Å, a floating gate (FG) 16, an intergate insulation film (e.g., ONO film) 17, and a control gate (CG) 18, which are formed on a channel region in sequence. The source region 13, the drain region 14, and the control gate 18 are connected to a source line SL, a bit line BL, and a word line WL, respectively.

During a writing operation, the source line SL and the substrate 19 are grounded in the NOR flash memory cell 10 with the stacked gate structure. The word line WL is supplied with a word line voltage of about 10V, while the bit line BL is supplied with a bit line voltage of about 5V. Under this bias condition, electrons are injected into the floating gate 16 from a channel region adjacent to the drain region 14. This mechanism is referred to as "hot electron injection."

In general, when a voltage of about 5V is being applied to the drain region 14 of the memory cell during a writing operation, a cell current about 200μA flows through the channel region from the drain region 14 to the grounded source region 13. For instance, if data bits in the unit of a byte or a word are written at a time, the byte writing operation uses a current of 1.6 mA (200 μA×8) at maximum while the byte writing operation uses a current of 3.2 mA (200 μA×16) at maximum.

FIG. 2 is a section of a NOR flash memory cell 20 with a split gate structure.

Referring to FIG. 2, the memory cell 20 includes N+ source and drain regions 23 and 24 formed in an N-type substrate 29, and a gate oxide film 25 and a floating gate (FG) 26 which are formed on a channel region. On the floating gate 26, a tunnel oxide film 27 is formed. A control gate (CG) 28 is formed on the tunnel oxide film 27 and the gate oxide film 25 that is placed on the channel region. The source region 23, the drain region 24, and the control gate 28 are connected to a source line SL, a bit line BL, and a word line WL, respectively.

Generally, during a writing operation, the source line SL of the NOR flash memory cell 10 with the stacked gate structure is supplied with a source line voltage VSL of about 9V, while the word line WL is supplied with a word line voltage VWL of about 10V. The bit line BL is supplied with a bit line voltage VBL of about 0.5V to 2V. Under this bias condition, electrons are injected into the floating gate 26 from a channel region adjacent to the source region 24 in the mechanism of hot electron injection. In the NOR flash memory cell 20 of a split gate structure, a writing voltage of about 9V is applied to the source line SL during a writing operation.

As aforementioned, since a high voltage of about 4V through 6V is applied to the drain region of the stacked-gate NOR flash memory cell 10 during a writing operation, a writing current of a predetermined level is used. A high voltage used in the NOR flash memory during a writing operation is generated from a charge pump embedded therein. Therefore, the number of memory cells to be written at a time for reducing current consumption is confined within a restrictive number (e.g., 4, 8, 16, or 32 bits). This restriction on the number of bits to he written is more applicable to the split-gate NOR flash memory rather than the stacked-gate NOR flash memory.

In addition, the restriction of the writable bit number is also applied to a test operation conducted during production. Generally, as production quality test is carried out to check functions of products themselves, and there is generally less current consumed during testing than in normal operation. Accordingly, given the reduced current consumption, the length of time needed to complete the testing is relatively long.

SUMMARY OF THE INVENTION

Exemplary embodiments of the present invention are directed to providing a flash memory device and writing method capable of conducting a test-writing operation in high frequency without affecting a writing condition of memory cells.

An aspect of the present invention is a flash memory device including a memory cell array having pluralities of memory cells. A data writing buffer temporarily stores data to be written into the memory cell. A control circuit controls a writing operation of the memory cell. A decoder decodes a writing address of the memory cell in response to the control circuit and regulates a constant current to flow through a selected bit line with reference to a result of the decoding. The decoder decodes an address and controls a current in the unit of a memory cell during a normal writing mode, and decodes an address and controls a current in the unit of memory block during a test writing mode.

Another aspect of the present invention is a flash memory device including a memory cell array having pluralities of memory cells. A data writing buffer temporarily stores data to be written into the memory cell. A control circuit controls a writing operation of the memory cell. A decoder decodes a writing address of the memory cell in response to the control circuit and regulates a constant current to flow through a selected bit line with reference to a result of the decoding. The decoder includes a decoding circuit decoding an address in the unit of a memory cell during a normal writing mode, and an address in the unit of a memory block during a test writing mode. A current regulator controls a constant writing current to flow into the selected bit line in response to a result of the decoding and a bias voltage. A bias circuit provides the bias voltage to the current regulator.

In an embodiment, the current regulator includes a current mirror circuit.

In an embodiment the decoder selects multiple memory cells of the memory cell array at a time.

In an embodiment, the decoder corresponds to each of the memory blocks of the memory cell array, designating multiple memory blocks, at a time, and writing data into the designated memory blocks.

In an embodiment, the decoder controls a current in the unit of a memory cell in the normal writing mode and controls a current in the unit of a memory cell in the test writing mode.

In an embodiment, the bias circuit generates voltages different from each other in reading and writing modes.

In an embodiment the decoder is comprised of decoding lines, for selecting a memory cell, independent from each other in reading and writing modes.

Exemplary embodiments of the present invention further provide a method of writing data into a flash memory. The method includes determining an operation mode of the flash memory. An address is decoded in the unit of a memory cell if the operation mode is a normal writing mode. A constant current is regulated to flow through a bit line of the decoded memory cell. The decoded memory cell is written with data stored in a write buffer through the bit line. An address is decoded in the unit of a memory block if the operation mode is a test writing mode. A constant current is regulated to flow through a bit line of the decoded memory block. The decoded memory block is written with data stored in the write buffer through the bit line.

In an embodiment, the number of data bits writable into memory cells in the normal writing mode is confined in a predetermined number.

In an embodiment, during the test writing mode, writing operations are conducted to memory cells at a time in a range of data stored in the write buffer.

In an embodiment, during the test writing mode, writing operations are conducted to one or more memory blocks at a time.

A further understanding of the nature and features of exemplary embodiments of the present invention may be realized by reference to the specification and the attached drawings.

BRIEF DESCRIPTION OF THE DRAWINGS

Exemplary embodiments of the present invention will be described with reference to the following figures, wherein like reference numerals may refer to like parts throughout the various figures. In the figures.

DETAILED DESCRIPTION OF EXEMPLARY EMBODIMENTS

Figure 1:
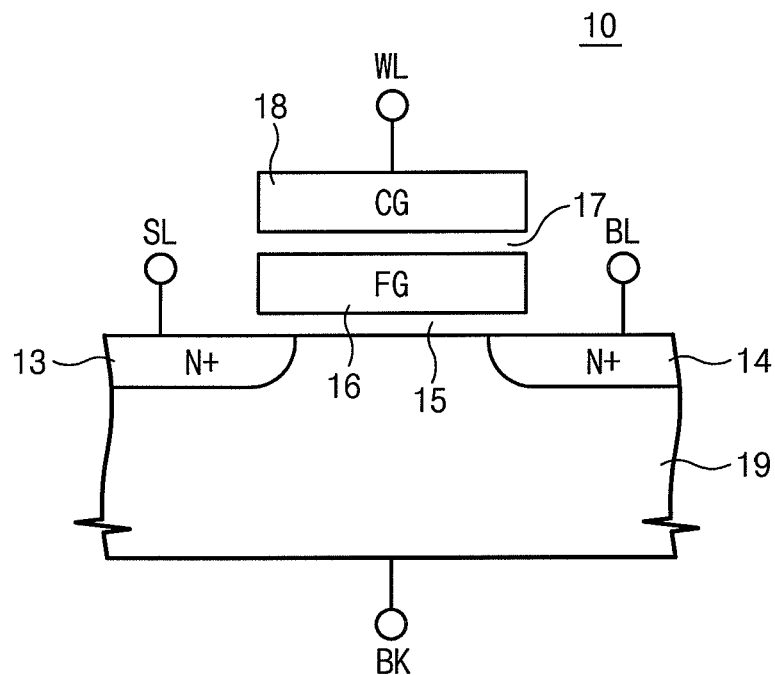
FIG. 1 illustrates a section of a NOR flash memory cell with a stacked gate structure.

Exemplary embodiments of the present invention will be described below in more detail with reference to the accompanying drawings. The present invention may, however, be embodied in different forms and should not be constructed as limited to the embodiments set forth herein. Like reference numerals may refer to like elements throughout the accompanying figures.

Figure 3:
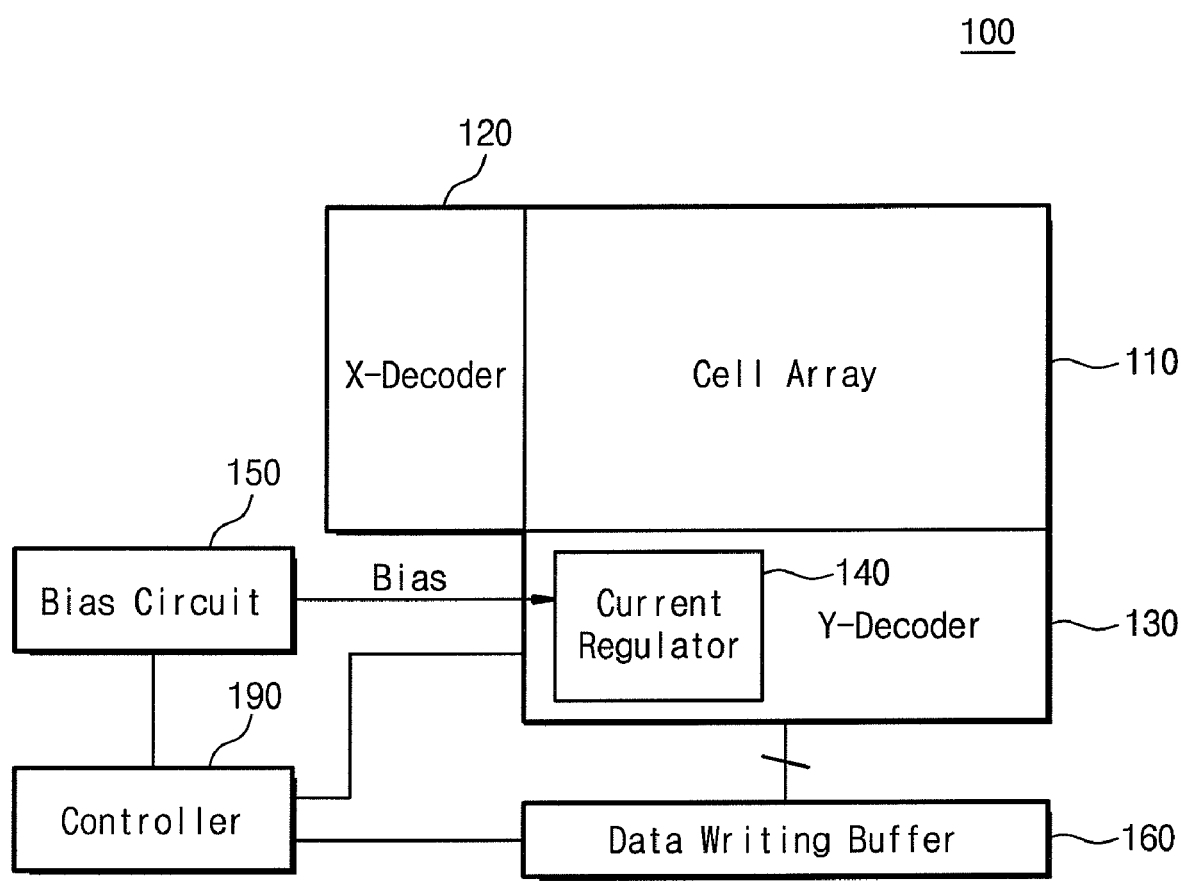
FIG. 3 is a block diagram illustrating a flash memory device in accordance with an exemplary embodiment of the present invention.

FIG. 3 is a block diagram illustrating a flash memory device 100 in accordance with an exemplary embodiment of the present invention. FIG. 3 shows a functional structure of a split-gate NOR flash memory device in which a constant writing current flows through a selected cell during a writing operation.

Referring to FIG. 3, the flash memory device 100 is comprised of a memory cell array 110, an X-decoder 120, a Y-decoder 130, a current regulator 140, a bias circuit 150, a data writing buffer 160, and a control circuit 190.

Figure 2:
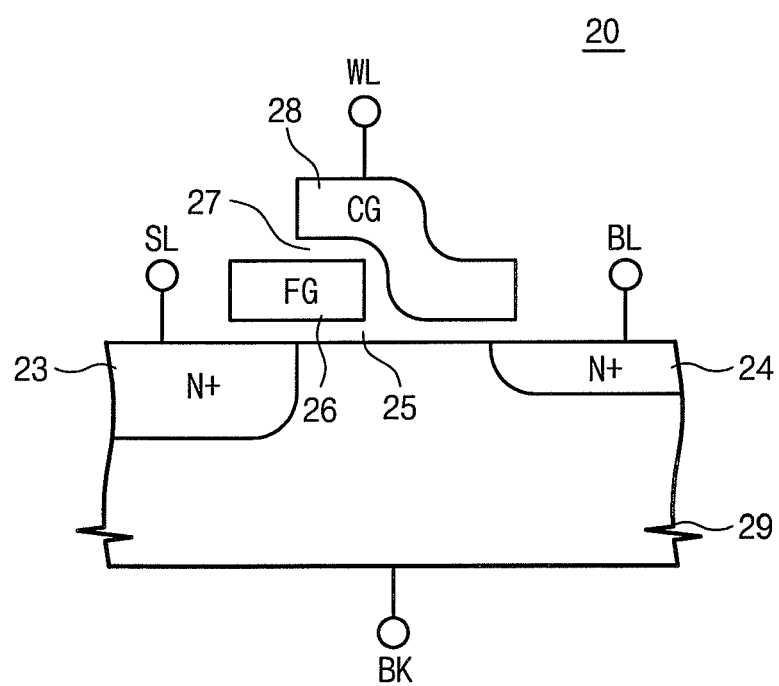
FIG. 2 illustrates a section of a NOR flash memory cell with a split gate structure.

The memory cell array 110 includes plural NOR flash memory cells in split gate structure. Each memory cell is substantially identical to the memory cell 20 shown in FIG. 2 in architecture. In the memory cell array 110, pluralities of bit lines BL and word lines WL are arranged such that they intersect. The control circuit 190 operates to control a writing operation for the memory cells of the memory cell array 110.

The X-decoder 120 selects a word line from decoding a row address X_Add for a memory cell. The Y-decoder 130 selects a bit line BL from decoding a column address Y_Add for a memory cell. The Y-decoder 130 operates to decode a column address for a memory cell to be written during a normal writing mode. The Y-decoder 130 may also operate to decode pluralities of column addresses (e.g., column addresses corresponding to memory blocks) to be tested by the control circuit 190 during a test writing mode. Further, the Y-decoder 130 regulates current to provide a constant amount of current to a selected plurality of bit lines. This current regulating function of the Y-decoder 130 is conductive in all of the normal and test writing modes. As will be detailed later, according to an operation of the Y-decoder 130, the functions of bit line selection and current regulation are all carried out in the Y-decoder 130. There is no limit to the number of memory cells that may be written at the same time. Thus, a writing operation may be conducted for a plurality of memory cells (e.g., memory cells in the unit of memory block), during the test writing mode, even in a condition for the normal writing mode.

For the split-gate NOR flash memory device, a constant amount of current is supplied to selected bit lines due to the inherent characteristics thereof. For this reason, the Y-decoder 130 is comprised of the current regulator 140, providing a constant current into a selected bit line during the test writing mode as well as the normal writing mode. The current regulator 140 includes pluralities of current sink circuits for regulating an amount of current flowing through the bit line BL. Each current sink circuit is connected to the bit line. An organization of the current regulator 140 will be detailed hereinafter with reference to FIGS. 6 and 8.

The bias circuit 150 applies a bias voltage Bias to the current regulator 140 in response to an output of the control circuit 190. The bias voltage Bias from the bias circuit 150 is applied in common to the plural current sink circuits of the current regulator 140. If the bias voltage Bias is applied to the plural current sink circuits at a time, a level of the bias voltage Bias would be reduced due to insufficient current. To minimize reduction of the bias voltage Bias, the current regulator 140 may include the same transistors as the Y-decoder 130 or may be formed of current mirrors.

The data writing buffer 160 ('write driver'), receives data to be written ('write data') in a predetermined unit (e.g., 8, 16, or 32 bits). The write data includes data '0' or '1.' Here, data '0' means a data bit to be substantially written into the memory cell array 210, while data '1' means a data bit not to be written (e.g., program-inhibited data). Generally, if write data is '0,' a voltage of about 0.5V is applied to a selected bit line. Thereby, a selected memory cell is changed from '1' to '0.' Otherwise, if write data is '1,' a voltage of about 2V is applied to a selected bit line. During this, a selected memory cell maintains its state of data '1.'

Data stored in the data writing buffer 160 is written into a selected memory cell under the following bias condition: a source line voltage VSL of about 9V is applied to a source line SL connected to a selected memory cell, while a word line voltage VWL of about 2V is applied to a word line WL coupled to the selected memory cell. A bit line BL of the selected memory cell is supplied with a bit line voltage of about 0.5 to 2V by write data. Under this bias condition, electrons are injected into a floating gate from a channel region adjacent to a source region by hot electron injection, completing a writing operation.

Figure 4:
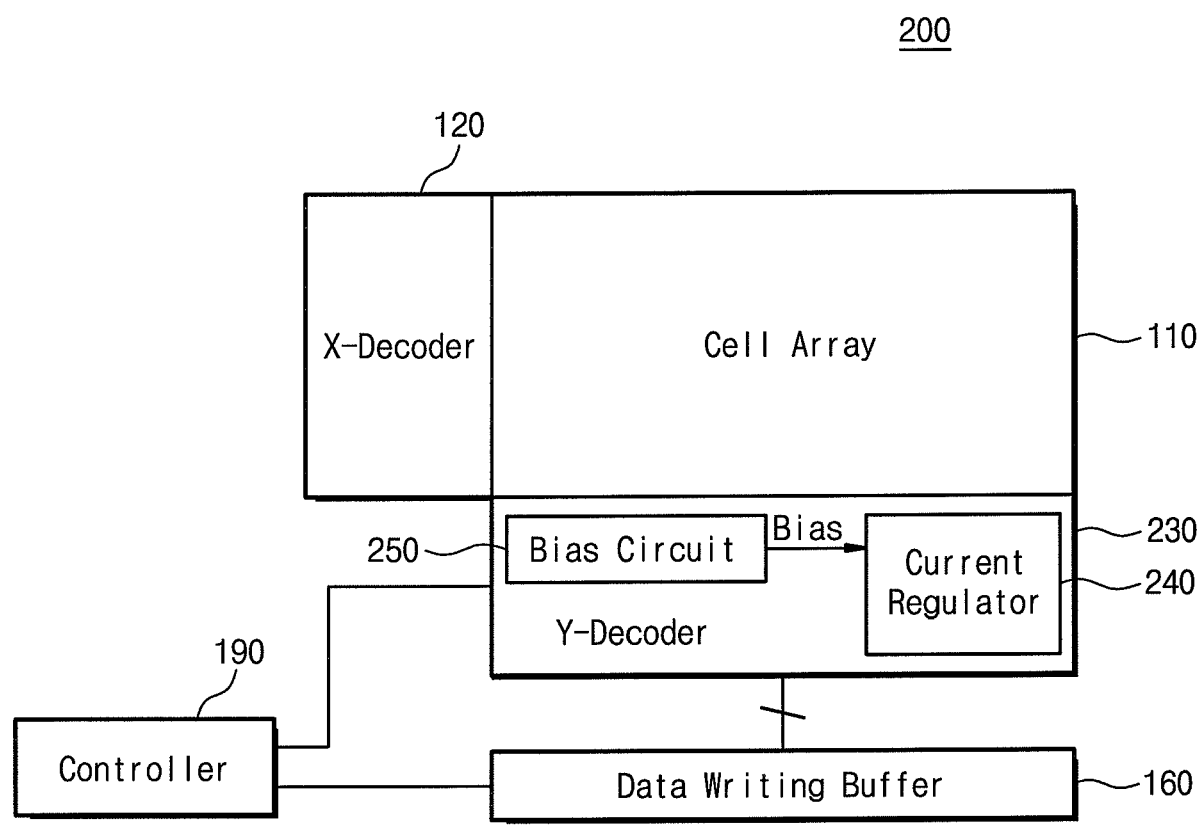
FIG. 4 is a block diagram illustrating a flash memory device in accordance with an exemplary embodiment of the present invention.

FIG. 4 is a block diagram illustrating a flash memory device 200 in accordance with an exemplary embodiment of the present invention. Referring to FIG. 4, the flash memory device 200 is substantially similar to the flash memory device 100 shown in FIG. 3, but in the device of FIG. 4, a Y-decoder 230 is comprised of a current regulator 240 and a bias circuit 250. Thus, the same reference signs are provided to the substantially similar elements to obviate duplications in description.

Functions operated by the Y-decoder 230, the current regulator 240, and the bias circuit 250 are also similar to those aforementioned in conjunction with FIG. 3.

As is described below, as the flash memory device 100 or 200 is equipped with the current sink function in the Y-decoder 130 or 230, it is able to increase the number of simultaneously writable memory cells in the test writing mode by controlling an address decoding operation of the Y-decoder 130 or 230. The flash memory device 100 or 200 is able to conduct a simultaneous writing operation with the data stored in the Y-decoder 130 or 230 without restricting the number of simultaneously writable memory cells. A. current is constantly supplied to all of the selected bit lines at a time in a writing operation so the Y-decoder 130 or 230 includes the current regulator 140 or 240.

Figure 5:
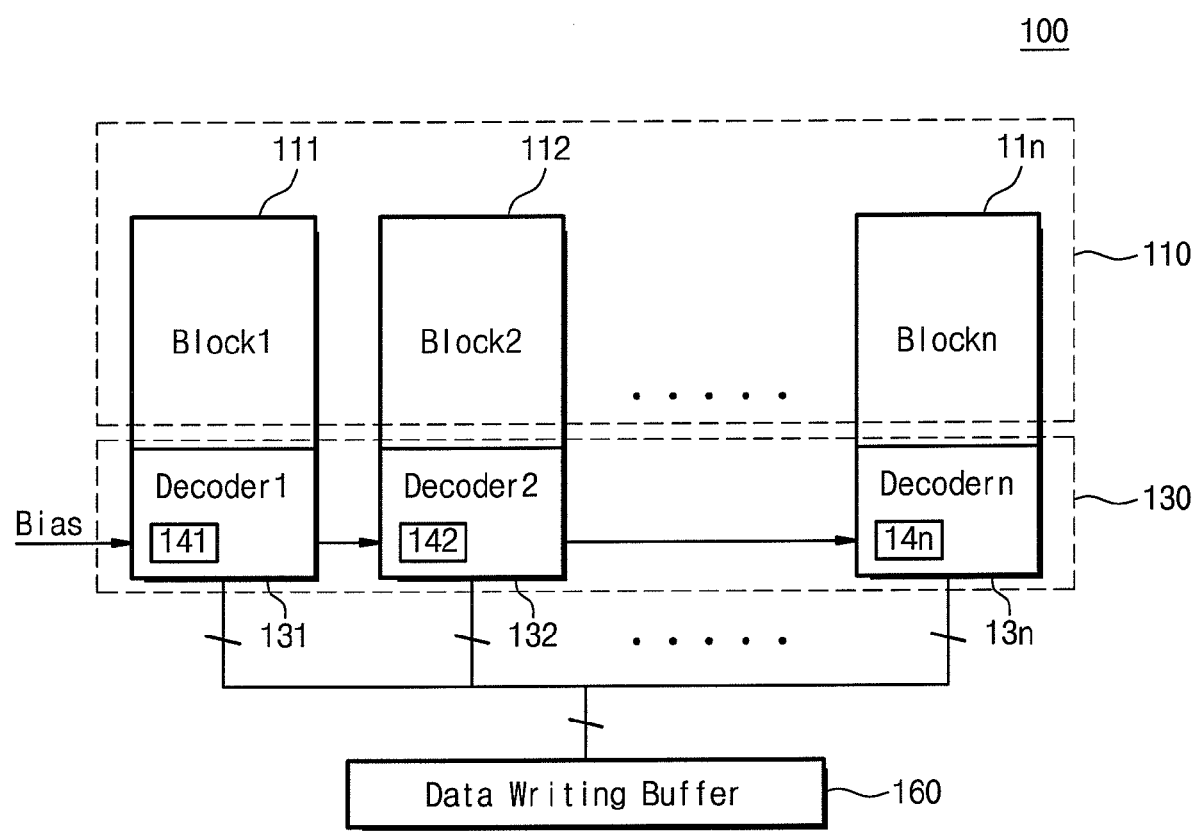
FIG. 5 is a schematic illustrating a current regulation mode, during a writing mode, in accordance with an exemplary embodiment of the present invention.

FIG. 5 is a schematic illustrating a current regulation mode, during a writing operation, in accordance with an exemplary embodiment of the present invention.

Referring to FIGS. 3 and 5, the memory cell array 110 includes pluralities of memory blocks 111, 112, ..., and 11*n* (111 through 11*n*), and the Y-decoder 130 includes pluralities of decoder units 131, 132, ..., and 13*n* (131 through 13*n*) corresponding to the memory blocks 111 through 11*n*. The decoder units 131 through 13*n* are each comprised of current regulation units 141, 142, ..., and 14*n* (141 through 14*n*). The current regulation units 141 through 14*n* share a bias voltage line Bias, providing constant currents to their corresponding blocks 111 through 11*n*.

In the normal writing mode, the Y-decoder 130 selects bit lines in a restrictive number (e.g., 4, 8, 16, or 32 bits). The plural current regulation units 141 through 14*n* included in the Y-decoder 130 provide constant currents to the selected bit lines in response to the bias voltage Bias input from the bias circuit 150 during the normal writing mode.

Otherwise, in the test writing mode, the Y-decoder 130 selects pluralities of bit lines at a time in correspondence with data (e.g., data corresponding to one block) stored in the data writing buffer 160. The plural current regulation units 141 through 14*n* of the Y-decoder 130 provide constant currents to the selected bit lines in response to the bias voltage Bias input from the bias circuit 150 during the test writing mode. As a result, information of the data writing buffer 160 is written into plural memory cells included in the selected memory block at the same time.

The current regulator 140 is built in the Y-decoder 130. Thus, during the test writing mode, it is permissible to write data into multiple memory cells of a memory block at a time, or to simultaneously designate plural memory blocks and write data therein. Further, since a constant current is supplied to a selected memory cell in the normal writing mode, it is possible to conduct a stable writing operation without variation of writing condition for memory cell.

Figure 6:
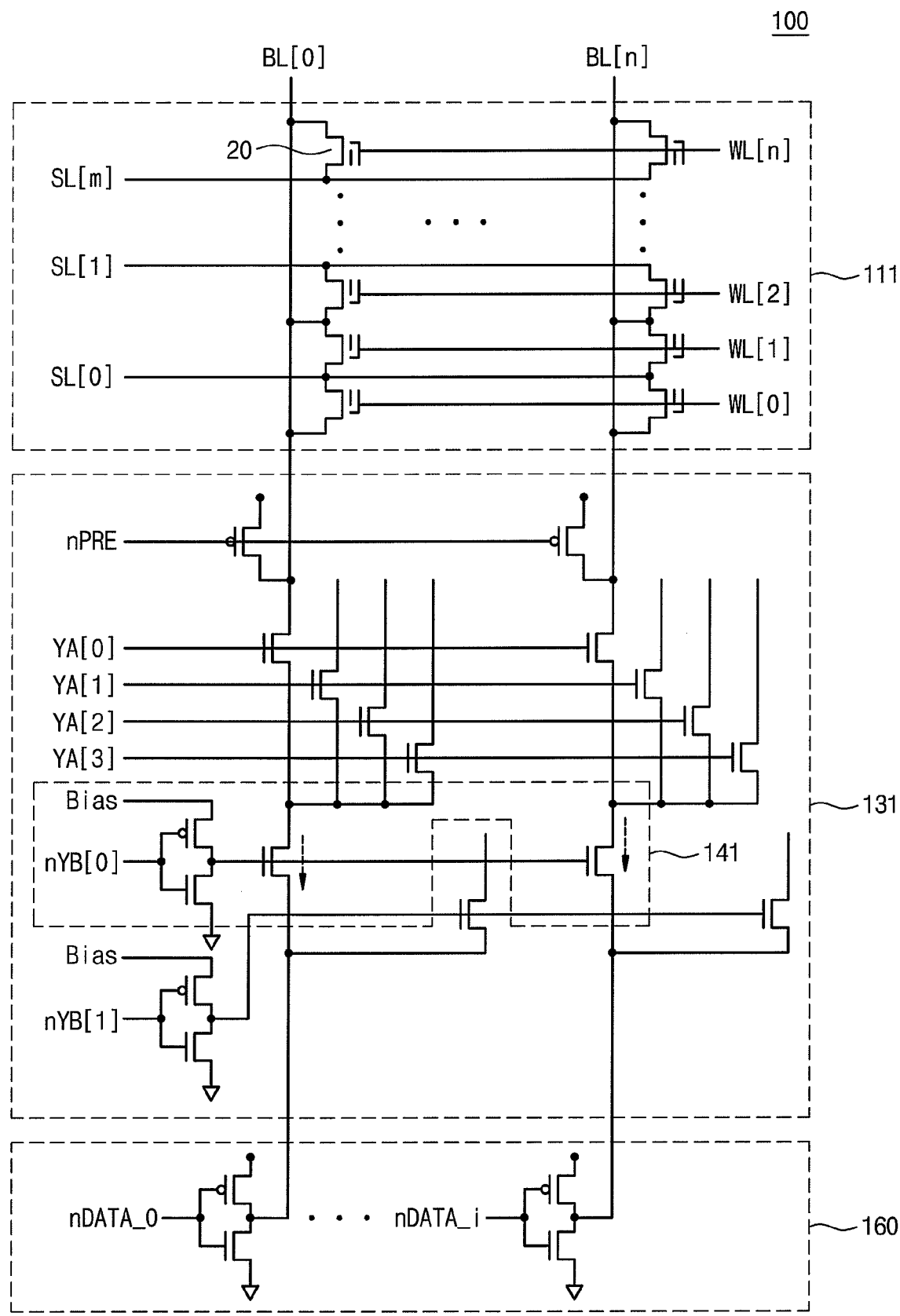
FIG. 6 is a circuit diagram illustrating an exemplary structure of FIG. 5.

FIG. 6 is a circuit diagram illustrating a detailed structure of FIG. 5. FIG. 6 representatively showing a circuit structure including the memory block 111 as one of the plural memory blocks 111 through 11*n* and peripherals corresponding thereto according to an exemplary embodiment of the present invention.

Referring to FIG. 6, the Y-decoder 130 is able to select one or more of the bit lines BL[0] through BL[n] through the decoder 131. A detailed operating feature of the current regulator 140 is explained below in conjunction with FIG. 8.

Ordinary operations of the split-gate NOR flash memory device are described below. Hereinafter, storing data into a memory cell or memory cells is referred to as 'writing' or 'programming.'

In an erasing mode, the word lines WL[0] through WL[n] of the memory cell array 111 are supplied with a high voltage of about 9V, while the source lines SL[0] through SL[n] and the bit lines BL[0] through BL[n] are supplied with a ground voltage. In a writing mode, a high voltage of about 9V is applied to a selected one of the source lines SL[0] through SL[n] while the ground voltage is applied to deselected source lines. A voltage of about 1.2V is applied to a selected one of the word lines WL[0] through WL[n] while the ground voltage is applied to deselected word lines. With this environment, corresponding memory cells are conductive in a writing operation when a voltage of about 0.3V is applied to the bit lines BL[0] through BL[n], but inhibited from the writing operation when the ground voltage is applied to the bit lines BL[0] through BL[n]. In a reading mode, the ground voltage is applied to a selected one of the source lines SL[0] through SL[n] while the power source voltage is applied to deselected source lines. The power source voltage is applied to a selected one of the word lines WL[0] through WL[n] while the ground voltage is applied to deselected word lines. During this, if a voltage of about 0.5V is applied to a selected one of the bit lines BL[0] through BL[n] while the ground voltage is applied to deselected bit lines, memory cells corresponding thereto are put into the reading mode. In a standby mode, the source lines SL[0] through SL[n], the word lines WL[0] through WL[n], and the bit lines BL[0] through BL[n] are held on the ground voltage in level.

Figure 7:
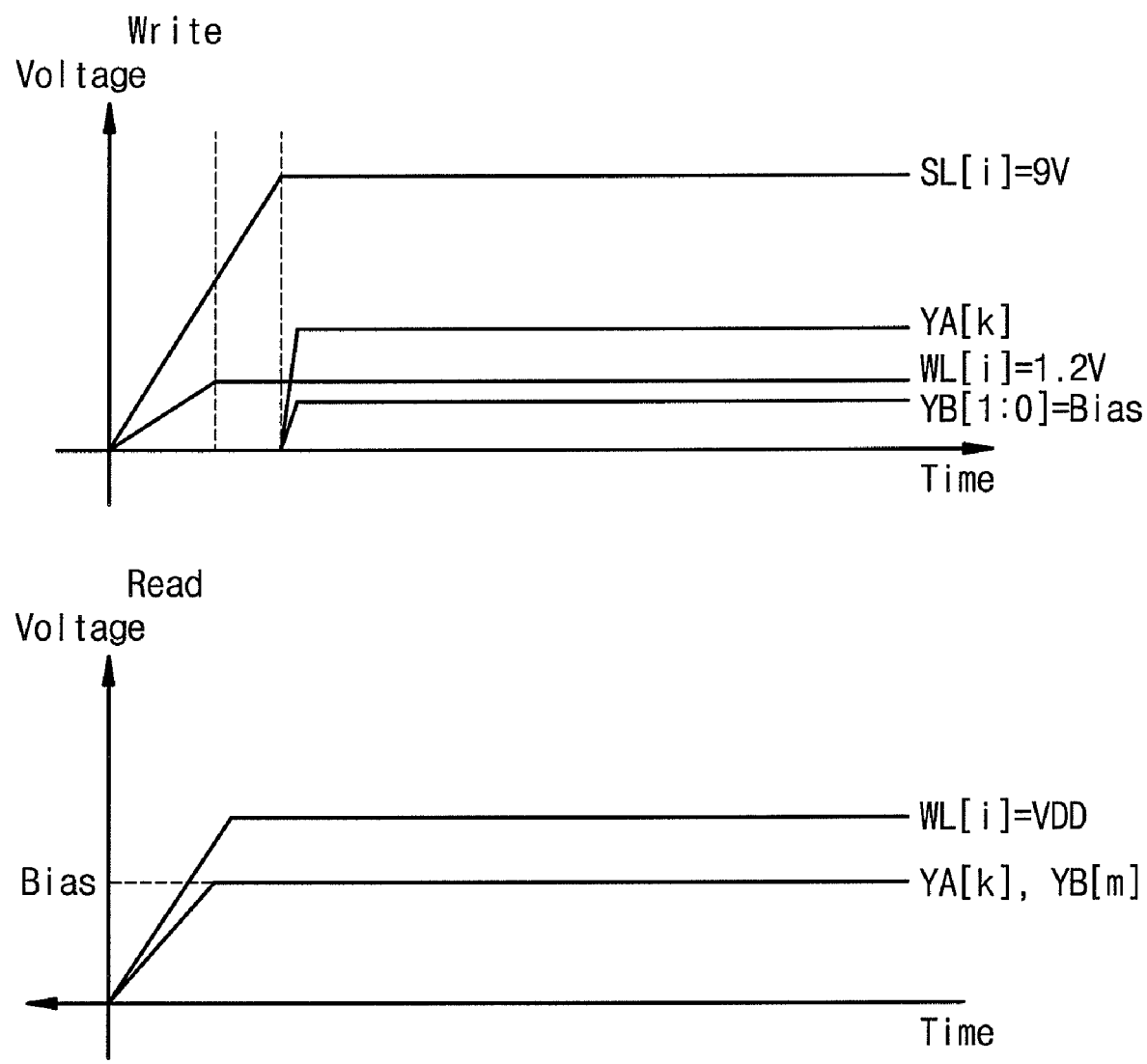
FIG. 7 is a graph showing conditions of voltages applied to the circuits of FIG. 6 during writing and reading modes.

FIG. 7 shows conditions of voltages applied to the circuits of FIG. 6 during writing and reading modes.

Referring to FIGS. 5 through 7, in the writing mode, a selected source line SL[i] is supplied with about 9V and a selected word line WL[i] is supplied with about 1.2V. According to the writing voltage aforementioned with respect to FIG. 5, a voltage of about 0.35V to 0.5V is detected from a corresponding bit line BL[j]. A user conducts a writing operation in the same condition with that for writing data into the memory cell 20. During this, the Y-decoder 130 controls a writing current by applying a predetermined voltage, which is enough to turn a decoding transistor on, to a selected one YA[k] of the memory cell selection lines (for example, column gate lines), and applying the bias voltage, which is enough to turn a current regulation transistor on, to a memory cell selection line nYB[0:1]. A voltage is applied to a gate line with conditioning a current to flow with a predetermined level from a source to a drain in the current regulation transistor.

In the reading mode, a selected word line WL[i] is supplied with the power source voltage while gate lines YA[k] and nYB[m] are supplied with the bias voltage. A current may be regulated even during a reading operation. The bias voltage may be a logical voltage input through a CMOS circuit or an analogue voltage.

According to an exemplary embodiment of the present invention, it is permissible to independently form decoding routes in selecting memory cells during the writing and reading modes. This is described below with reference to FIGS. 8 and 9.

Figure 8:
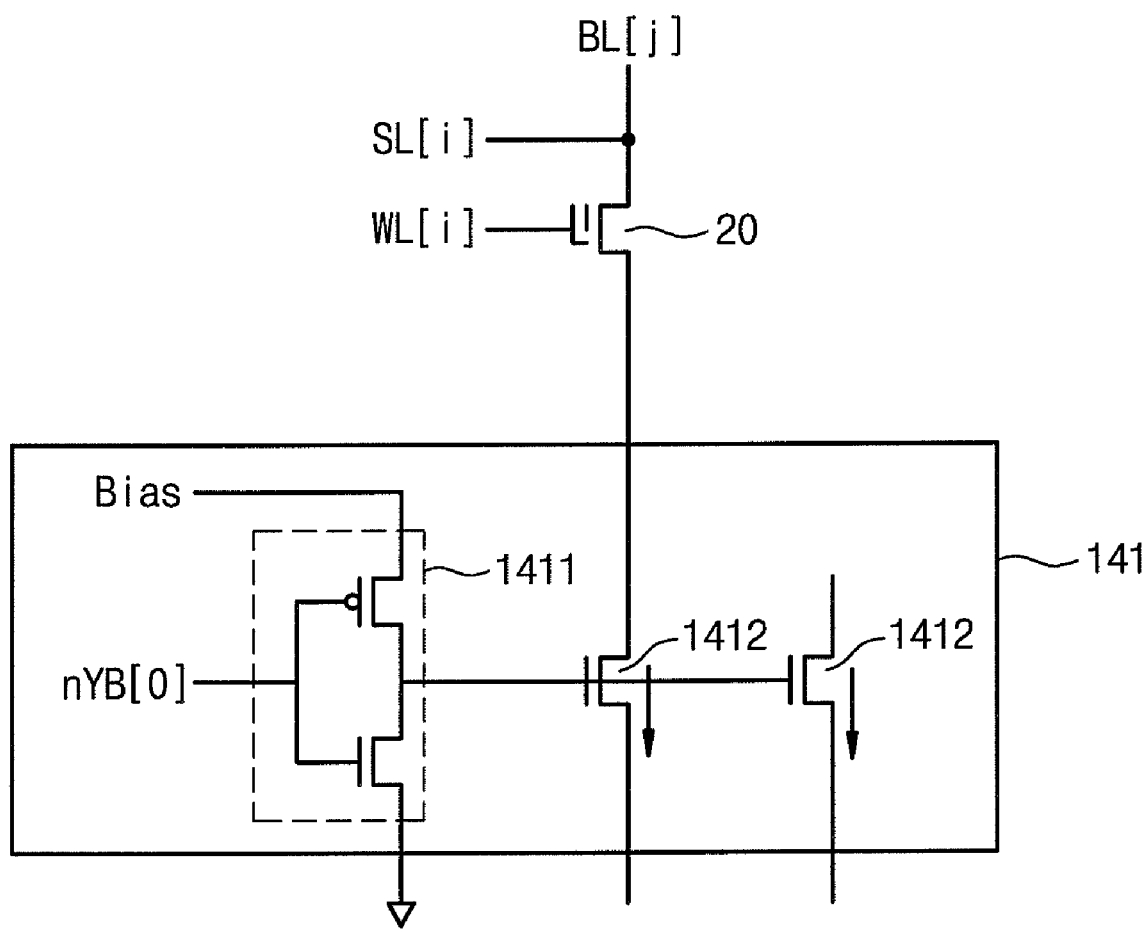
FIGS. 8 and 9 are circuit diagrams illustrating an exemplary circuit structure of the current regulation unit shown in FIG. 6 and decoding routes during writing and reading modes.
Figure 9:
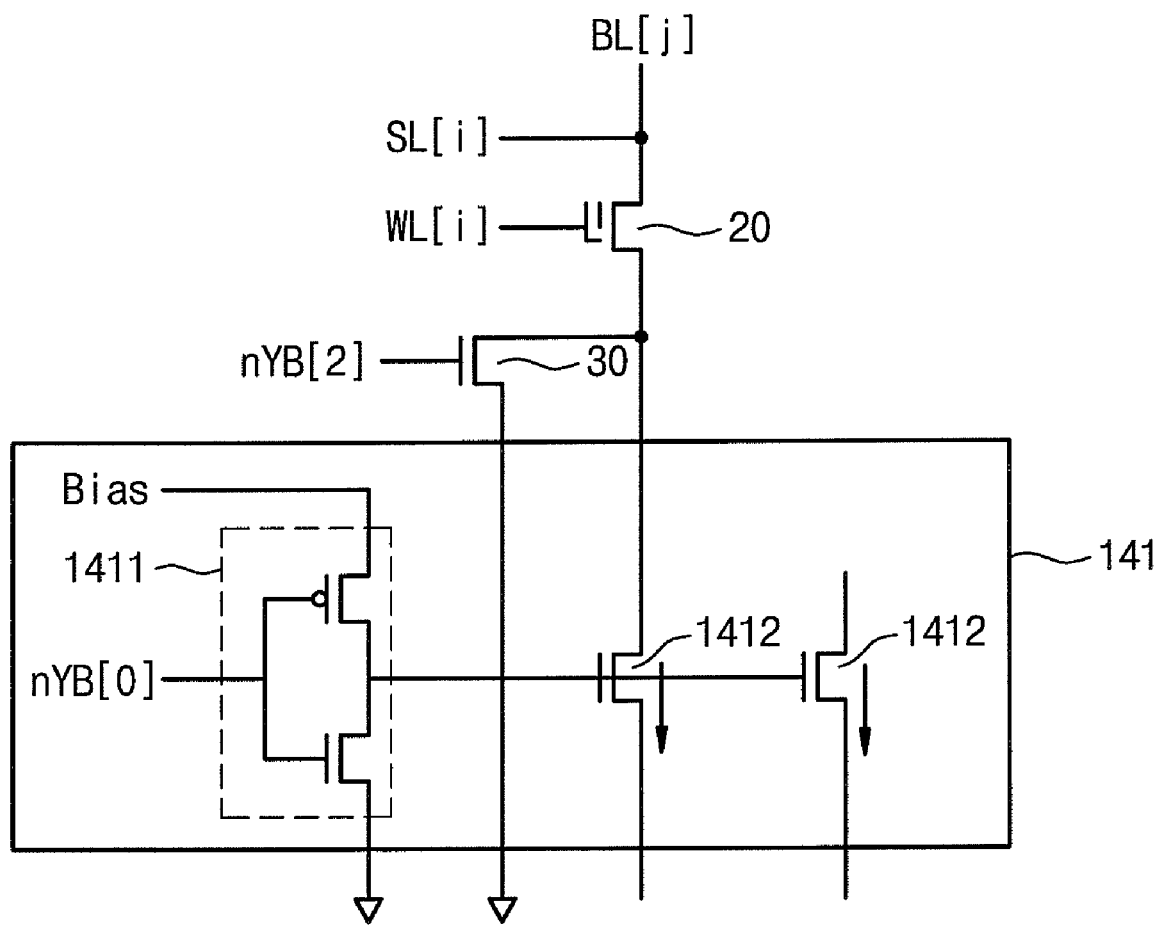

FIGS. 8 and 9 are circuit diagrams illustrating a circuit structure of the current regulation unit 141 shown in FIG. 6 and decoding routes during writing and reading modes according to an exemplary embodiment of the present invention.

First, referring to FIG. 8, the current regulation unit 141 is comprised of a voltage applying circuit 1411 and a plurality of current sink circuits 1412.

The voltage applying circuit 1411 is comprised of PMOS and MMOS transistors serially connected between the bias voltage Bias and the ground voltage. The PMOS and NMOS transistors forming the voltage applying circuit 1411 function as an inverter for making an output from inverting a signal of nYB[0]. The output of the voltage applying circuit 1411 is applied to the plurality of current sink circuits 1412 in common. Each current sink circuit 1412 makes a constant current flow into its corresponding bit line BL[j] in response to the output of the voltage applying circuit 1411. For this operation, the current sink circuit 1412 is formed of an NMOS transistor that is turned on or off, responding to the output of the voltage applying circuit 1411 through a gate thereof. The current regulation unit 141 may be formed of a current mirror circuit to prevent an abrupt drop of the bias voltage Bias provided from the bias circuit 150.

The memory cell 20 is connected to its corresponding word and bit lines WL[i] and BL[j]. In the writing mode for the memory cell 20, a current flows from the source line Sl[i] toward the bit line BL[j]. Another circuit element may be interposed between the bit line BL[j] and the current sink circuit 1412.

If a high level signal of nYB[0] is applied to an input terminal of the voltage applying circuit 1411, the NMOS transistor is turned on while the PMOS transistor is turned off. As a result, the voltage applying circuit 1411 outputs 0V, for example, a low level signal. The current sink circuits 1412 are turned off in response to 0V output from the voltage applying circuit 1411. Thus, a current cannot flow through the selected bit line BL[j]. If a low level signal of nYB[0], e.g., 0V, is applied to an input terminal of the voltage applying circuit 1411, the PMOS transistor is turned on and the bias voltage Bias is applied to the gate nodes of the current sink circuits 1412. The voltage applying circuit 1411 outputs a voltage corresponding to the bias voltage Bias, for example, a high level signal. An amount of current passing through the current sink circuits 1412 is regulated by the bias voltage Bias.

The gate nodes of the current sink circuits 1412 are commonly coupled to the output terminal of the voltage applying circuit 1411, receiving the bias voltage Bias provided through the voltage applying circuit 1411. Therefore, the voltage applying circuit 1411 is able to control an amount of current passing through the plural current sink circuits 1412 that are coupled to each other through the gate nodes. The bias voltage Bias is a logical signal supplied to the CMOS inverter of the PMOS and NMOS transistors, controlling the plural current sink circuits 1412. Meanwhile, the voltage of about 9V applied to the source line SL[i] of the memory cell 20, in the writing mode, may be externally provided in accordance with current capacity.

FIG. 9 shows a decoding route of the reading mode, which is formed independent from a decoding route of the writing mode.

Referring to FIG. 9, the flash memory device 100 may be comprised of a decoding transistor 30 to switch the decoding route during the reading mode. In this case, the decoding transistor 30 is controlled by a signal of nYB[2] that is activated in the reading mode. For example, a decoding operation in the writing mode is carried out by YA[k] and nYB[0:1], while a decoding operation in the reading mode is carried out by YA[k] and nYB[2].

Since the Y-decoder 130, according to an exemplary embodiment of the present invention, enables the decoding operations to be conducted independently in the writing and reading modes, it is able to execute a high-frequency writing operation without affecting a reading operation in the flash memory device.

Figure 10:
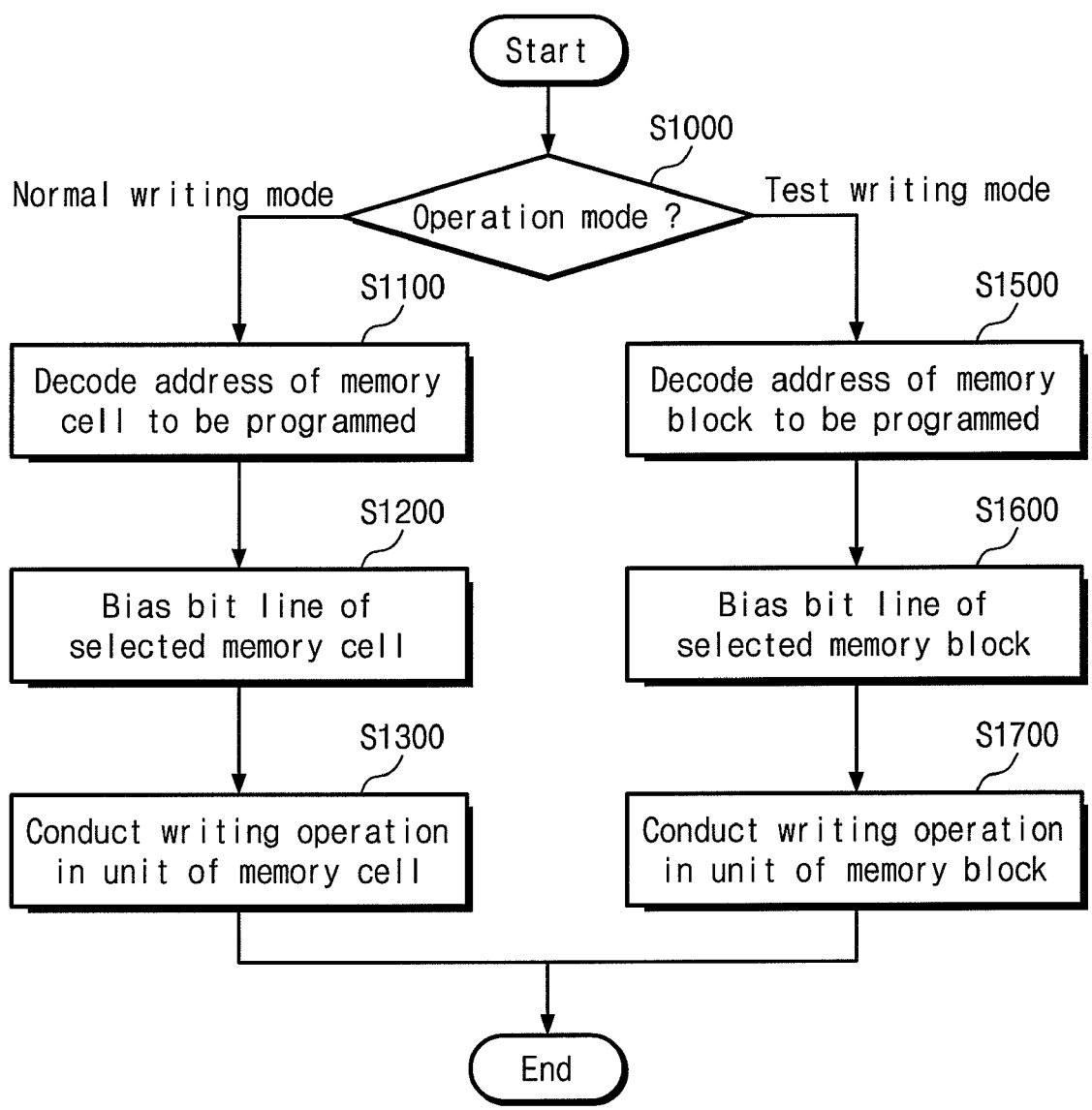
FIG. 10 is a flow chart showing a writing method for a flash memory device in accordance with an exemplary embodiment of the present invention.

FIG. 10 is a flow chart showing a writing method for the flash memory device in accordance with an exemplary embodiment of the present invention.

Referring to FIG. 10, in the writing method of an exemplary embodiment of the present invention, an operation mode of the flash memory 100 is determined (step S1000). Determining an operation mode is carried out by the control circuit 190. The control circuit 190 functions to control the decoding operation of the Y-decoder 130 and the current regulating operation of the current regulation circuit 140 that is included in the Y-decoder 130.

From the determination by the step S1000, if an operation mode is the normal writing mode, the X-decoder 120 and the Y-decoder 130 operate to decode an address of a memory cell to be written (step S1100). Subsequently, the current regulation circuit 140 embedded in the Y-decoder 130 controls a bias of a corresponding bit line BL[i] and makes a constant current flow into a bit line BL[i] of a selected memory cell in response to the bias voltage Bias provided from the bias circuit 150 (step 1200). Then, according to the bias condition of the split-gate NOR flash memory device as shown in FIG. 7, a writing operation in the unit of a cell is carried out to write data of the data writing buffer 160 into selected memory cells (step S1300), and the procedure is terminated. The writing operation in the step S1300 is carried out in the unit of a memory cell. In the normal writing mode, for the purpose of reducing power consumption of the flash memory device, the number of spontaneously writable memory cells is confined within a predetermined range (e.g., 4, 8, 16, or 32 bits).

From the determination of step S1000, if an operation mode is the test writing mode, the X-decoder 120 and the Y-decoder 130 operate to decode an address of a memory block to be written (step S1500). In the step S1500, the Y-decoder 130 operates to decode a column address, in response to an output of the control circuit 190, so as to write data into the selected memory block. Subsequently, the current regulation circuit 140 embedded in the Y-decoder 130 controls biases of the bit line BL[0] through BL[n] to make a constant current flow into the bit lines BL[0] through BL[n] of the selected memory block in response to the bias voltage Bias provided from the bias circuit 150 (step 1600). The biased bit lines BL[0] through BL[n] correspond to a single memory block. Then, according to the bias condition of the split-gate NOR flash memory device as shown in FIG. 7, a writing operation in the unit of block is carried out to write data of the data writing buffer 160 into selected memory blocks (step S1700), and the procedure is terminated.

In the test writing mode, there is no need to consider an amount of current consumed in the flash memory device. Therefore, according to an exemplary embodiment of the present invention, the writing operation in the test writing mode is conducted in units of a memory block at the same time for multiple memory blocks. As a result, a time for testing becomes shorter than for a conventional case. Additionally, as can be seen from the aforementioned, an operation of the normal mode is not affected by the bias conditions of the split-gate NOR flash memory. Although not shown, after completing the writing operations of the step S1300 and S1700, program-verifying operations are conducted to checking results of writing. Further, in the test writing mode, after completing the writing operation of the step S1700, a test verifying operation may be conducted to find a defect of memory cell by checking a result of writing.

The above description described a case of writing data in the unit of memory block during the test writing mode. However, the present invention is not limited to the provided examples. For example, within a range permissible by a capacity of the data writing buffer 160, it is possible to practice a simultaneous writing operation for one or plural memory blocks. Moreover, the features of the exemplary embodiments of the present invention described herein, for example, the simultaneous writing function, is also applicable to other types of nonvolatile memory device as well as the split-gate NOR flash memory device.

Figure 11:
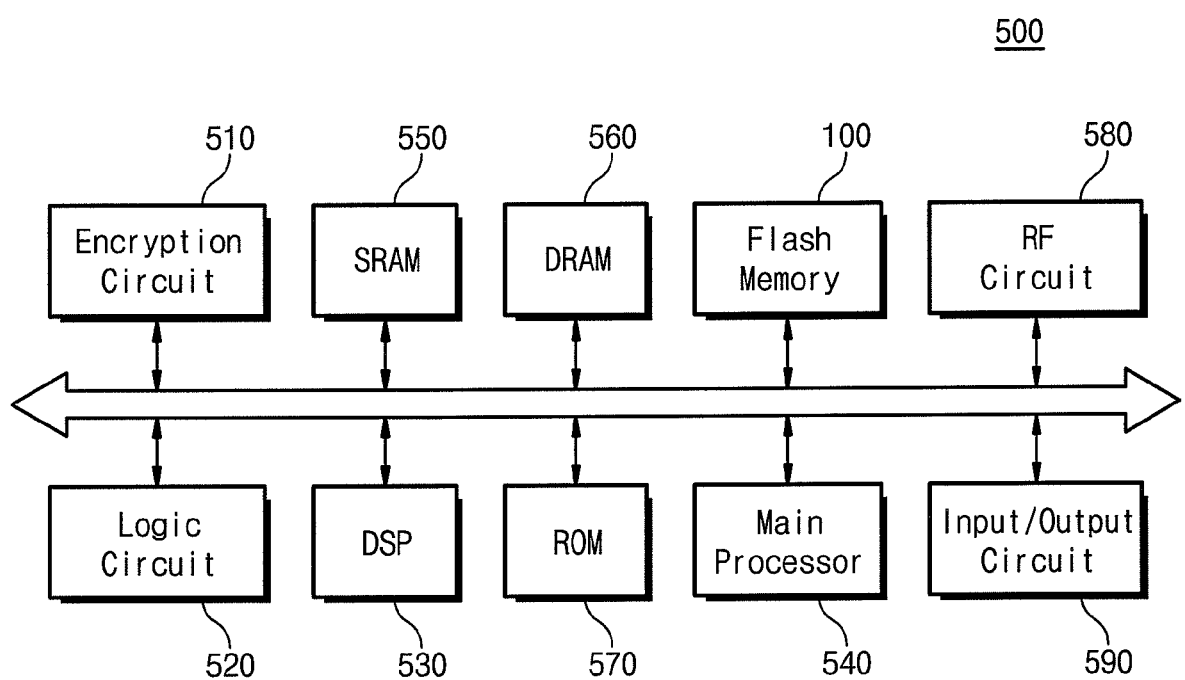
FIG. 11 is a block diagram showing a system employing the flash memory device according to an exemplary embodiment of the present invention.

FIG. 11 is a block diagram showing a system 500 employing the flash memory device 100 according to an exemplary embodiment of the present invention. FIG. 11 shows a memory card system including the flash memory device 100.

Referring to FIG. 11, the memory card system 500 includes an encryption circuit 510, a logic circuit 520, a digital signal processor (DSP) 530, and a main processor 540. The memory card system 500, as well as the flash memory device 100, also includes various memories, e.g., a static random access memory (SRAM) 550, a dynamic random access memory (DRAM) 560, and/or a read-only memory (ROM) 570. In addition, the memory card system 500 is comprised of an RF (high-frequency/microwave) circuit 580 and an input/output circuit 590. The functional blocks 510 through 590 comprised in the memory card system 500 are connected to each other by way of a system bus.

The memory card system 500 operates under the control of an external host (not shown), and the flash memory 100 stores system data therein or outputs data therefrom under the control of the host. The flash memory device 100 may be designed in a structure with a smaller size and lower current consumption suitable for a mobile storage such as the memory card system 500. Moreover, the flash memory device 100 according to an exemplary embodiment of the present invention is operable in a high-frequency test mode for mass production, satisfying the requirements for size and current consumption.

As described above, the flash memory device according to an exemplary embodiment of the present invention is able to conduct writing operations for multiple memory cells at a time in the test mode, without affecting a writing condition of memory cell. Therefore, it is possible to shorten a chip test time.

It is also permissible to conduct a function or operation, which is specified in a block, with modifications. For example, two successive blocks are substantially conductive at the same time or in the reverse sequence according to relevant functions or operations.

The above-disclosed subject matter is to be considered illustrative, and not restrictive.

What is claimed is:

1. A flash memory device comprising:
   a memory cell array comprising a plurality of memory cells;
   a data writing buffer temporarily storing data to be written into the memory cells;
   a control circuit configured to control a write operation of the memory cells; and
   a decoder configured to decode a write address of the memory cell in response to the control circuit and regulate a constant current to flow through a selected bit line with reference to a result of the decoding,
   wherein the decoder decodes an address and controls a current in units of a memory cell during a normal write mode, and decodes an address and controls a current in units of a memory block during a test writing mode.

2. The flash memory device as set forth in claim 1, further comprising a bias circuit providing a constant bias voltage to the decoder.

3. The flash memory device as set forth in claim 1, wherein the decoder is configured to select a plurality of memory cells from the memory cell array, and writes data into the selected memory cells.

4. The flash memory device as set forth in claim 3, wherein the selected plurality of memory cells are selected at the same time.

5. The flash memory device as set forth in claim 1, wherein the decoder corresponds to memory blocks of the memory cell array, and the decoder designates a plurality of the memory blocks, and writes data into the designated memory blocks.

6. The flash memory device as set forth in claim 2, wherein the decoder regulates the constant current in response to a level of the bias voltage.

7. The flash memory device as set forth in claim 2, wherein the bias circuit generates different voltages in a reading mode than in a writing mode.

8. The flash memory device as set forth in claim 1, wherein the decoder is comprised of decoding lines for selecting a memory cell, independent from each other in reading and writing modes.

9. A flash memory device comprising:
   a memory cell array comprising a plurality of memory cells;
   a data writing buffer temporarily storing data to be written into the memory cells;
   a control circuit configured to control a write operation of the memory cells; and
   a decoder configured to decode a write address of the memory cell in response to the control circuit and regulate a constant current to flow through a selected bit line with reference to a result of the decoding,
   wherein the decoder comprises:
   a decoding circuit decoding an address in units of a memory cell during a normal writing mode, and decoding an address in units of a memory block during a test writing mode;
   a current regulator controlling a constant writing current to flow into a selected bit line in response to a result of the decoding and a bias voltage; and
   a bias circuit providing the bias voltage to the current regulator.

10. The flash memory device as set forth in claim 9, wherein the decoder regulates the constant current in response to a level of the bias voltage.

11. The flash memory device as set forth in claim 9, wherein the decoder selects a plurality of memory cells from the memory cell array.

12. The flash memory device as set forth in claim 9, wherein the decoder corresponds to memory blocks of the memory cell array, and the decoder designates a plurality of the memory blocks, and writes data into the designated memory blocks.

13. The flash memory device as set forth in claim 9, wherein the decoder controls a current in the unit of a memory cell in the normal writing mode and controls a current in the unit of a memory block in the test writing mode.

14. The flash memory device as set forth in claim 9, wherein the bias circuit generates different voltages in reading modes than in writing modes.

15. The flash memory device as set forth in claim 9, wherein the decoder is comprised of decoding lines for selecting a memory cell, independent from each other in reading and writing modes.

16. A method of writing data into a flash memory, comprising:
    determining an operation mode of the flash memory;
    decoding an address in a unit of a memory cell when the operation mode is determined to be in a normal writing mode;
    regulating a constant current to flow through a bit line of the decoded memory cell;
    writing the decoded memory cell with data stored in a write buffer through the bit line;
    decoding an address in a unit of a memory block when the operation mode is determined to be in a test writing mode;
    regulating a constant current to flow through a bit line of the decoded memory block; and
    writing the decoded memory block with data stored in the write buffer through the bit line.

17. The method as set forth in claim 16, wherein the number of data bits writable into memory cells in the normal writing mode is limited to a predetermined number.

18. The method as set forth in claim 16, wherein in the test writing mode, write operations are conducted to memory cells in a range of data stored in the write buffer.

19. The method as set forth in claim 16, wherein the write operations are conducted to the memory cells at the same time.

20. The method as set forth in claim 16, wherein in the test writing mode, write operations are conducted to one or more memory blocks at a time.

* * * * *